United States Patent [19]

Bracher et al.

[11] Patent Number: 4,643,128
[45] Date of Patent: Feb. 17, 1987

[54] MULTIPLE HOLDER FOR SUBSTRATES TO BE TREATED

[75] Inventors: Bernhard Bracher, Balzers, Liechtenstein; Karl Baumann, Sargans; Hermann Staub, Azmoos, both of Switzerland

[73] Assignee: Balzers AG, Liechtenstein

[21] Appl. No.: 739,568

[22] Filed: May 30, 1985

[30] Foreign Application Priority Data

May 30, 1984 [CH] Switzerland ............... 2652/84

[51] Int. Cl.⁴ ............................................. B05C 13/02
[52] U.S. Cl. ............................. 118/503; 204/297 W
[58] Field of Search ............... 118/503, 728, 729, 730; 427/166; 204/297 W, 298; 248/DIG. 2; 269/254 R, 902

[56] References Cited

U.S. PATENT DOCUMENTS

| | | | |
|---|---|---|---|
| 2,532,971 | 12/1950 | Van Leer et al. | 118/730 X |
| 3,336,902 | 8/1967 | Lipton et al. | 118/503 |
| 4,455,964 | 6/1984 | Weber | 118/500 |

FOREIGN PATENT DOCUMENTS

| | | | |
|---|---|---|---|
| 2337204 | 1/1975 | Fed. Rep. of Germany | 118/730 |
| 58-9980 | 1/1983 | Japan | 118/730 |

Primary Examiner—John P. McIntosh
Attorney, Agent, or Firm—McGlew and Tuttle

[57] ABSTRACT

A multiple holder for substrates to be treated, particularly finish-ground spectacle lenses to be cleaned and then coated, comprises four arms 1a to 1d forming a rectangular cross. On their sides facing the four quadrants, the arms are provided with grooves for receiving the substrates 11 to be treated which substrates are forced by springs 4a to 4d to engage the grooves. The holder is used primarily for the secure holding and transportation of substrates during a sequence of treating operations.

5 Claims, 4 Drawing Figures

MULTIPLE HOLDER FOR SUBSTRATES TO BE TREATED

FIELD AND BACKGROUND OF THE INVENTION

This invention relates in general to coating by vapor deposition and to a new and useful multiple holder for substrates to be treated.

There are known various holding structures by which spectacle lenses are engaged by their edges and which, after receiving the load, may selectively be inserted into a cleaning or coating apparatus. However, problems arise recurrently with the failure of coating the entire surface of the substrates, up to the edges, because the retaining elements of the holders still cover small areas of the surfaces to be coated which, consequently, fail to become coated. This is a weighty drawback especially with spectacle lenses requiring not only a technologically satisfactory coating but also a perfect appearance.

Known are coating apparatuses in which the holders are shaped as planar plates having recesses for the substrate to be coated, with a plurality of such plates being inserted into a rotary structure to form together a spherical segment. Holders of this kind are generally suitable only for the respective coating apparatus, wherefore, prior to or after the coating, the substrates must usually be transferred to other supports which are suitable for the treatment in other apparatuses. This transfer represents additional time losses and costs in the process, which are not inconsiderable.

Since the individual substrates to be coated have varying sizes, frequently individual supports are employed which are adapted to the respective sizes and can be inserted into conformable holding structures which, in turn, are adapted to the apparatus in which the coating or other treatment is preformed. It will be understood that handling of such a system of supports or holders nested into each other is still rather expensive.

SUMMARY OF THE INVENTION

The present invention is directed to a multiple holder which is better adapted to the reception of substrates of different shape and size and simplifies the handling, thus saves labor by requiring only a single clamping and being usable without any changes for a plurality of processes or operations.

In accordance with the invention a multiple holder for substrates to be treated, for example, by being cleaned and then coated by vapor deposition or cathode sputtering, particularly for ground spectacle lenses comprises a plurality of holding rails which extend radially outwardly from a central portion and have grooves facing the space between adjacent rails for retaining the substrates. The grooves are made of a size to engage only the edges of the substrates such as spectacle lenses. The apparatus also includes clamping springs which urge the substrates into the grooves. A spring clamp is advantageously associated with each of the quadrants defined between adjacent rails and the springs advantageously comprise leaf-type springs which are secured at the outer ends of a flange portion of rails which form a central or median part of the device extending along a common axis. Such springs include rail portions which have grooves which engage the periphery of the lenses and hold them into the associated grooves of the rails.

This makes the handling more flexible, since the same holder is suitable for most various substrates, and simpler, since the substrates can be transferred sequentially into different treating stations, such as for preliminary chemical cleaning of the surface, and subsequent coating by vapor deposition or cathode sputtering, while being supported by still the same holder, and has also other advantages, primarily in the coating of spectacle lenses.

The design of the holder in the shape of a cross providing space for a simultaneous support of four, i.e. two pairs of spectacle lenses, offer a particular economy, since spectacle lenses are supplied in pairs. The security against mistakenly mixing up of lenses is increased as compared to holders which can receive five or more individual lenses. Also, with a suitable structure, four-piece holders are still small enough to form elements of usual spherical segment supports, so that all the surfaces to be coated can be positioned at substantially the same distance from an evaporative source, placed at the center of the spherical segment, and thus coated uniformly. The inventive holder in the shape of a four arm rectangular cross, for receiving spectacle lenses of different size, for changing and reversing the lenses to coat both sides if required, is very simple. Primarily however, it makes possible to coat the entire surface without leaving marginal strips and in a manner minimizing shadow areas.

Accordingly it is an object of the invention to provide an improved holder particular for spectacles which are to be coated by sputtering and which includes rail elements forming four separate quadrants for receiving of a spectacle lens in each thereof and wherein the rail portions have grooves into which the edges of the spectacles fit and they carry spring means which urge the spectacles into the associated grooves of the rails.

A further object of the invention is to provide a holder for devices to be treated which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 4:
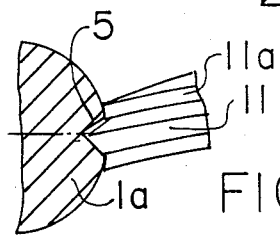
FIG. 4 is an enlarged partial cross sectional view similar to FIG. 3 of the contact area between a cross arm and an inserted spectacle lens.

Referring to the drawings in particular the invention embodied therein comprises a holder for articles which are to be treated such as by depositing materials thereon by vapor deposition or by sputtering. The device 10 comprises a plurality of intersecting rail members 1a, 1b, 1c, 1d which are arranged to extend radially outwardly from a central portion in which define quadrants A, B, C and D between adjacent ones receiving a substrate such as a lens 11 in each quadrant. In accordance with the invention each rail element 1a, 1b, 1c, 1d has a receiving groove 5 of a size to engage an edge 11a of the lens 11 as shown in FIG. 4 without engaging either the front or rear surface thereof. In accordance with a further feature of the invention, spring means are provided in the form of leaf spring members, 4a, 4b, 4c, 4d which are advantageously carried by the rail members 1b, and 1d which are arranged along a common axis. For this purpose, the rail elements 1b and 1d carry flanges 3, 3 which leaf springs 4a, 4b, 4c and 4d are secured. The leaf springs bear against a periphery of the substrate 11 and urge it into a receiving groove defined by the rail elements of the particular quadrant in which they are positioned.

In the drawing, the four straight arm portions of the cross forming a holder 10 are shown at 1a to 1d. These four arms are welded together. The weld should have smooth surfaces and be as far as possible free of holes and voids to prevent chemicals which might have deposited in cavities or depressions of the weld from being carried into the washing and cleaning station equipped with a plurality of tanks. The free ends of the vertical arms 1a, 1c as shown in Fig. are provided each with an end piece 2 suitable for being inserted into a conformable socket provided in a receiving unit such as washing, coating or other apparatus, and embodied in the shown example as a square head.

Figure 1:
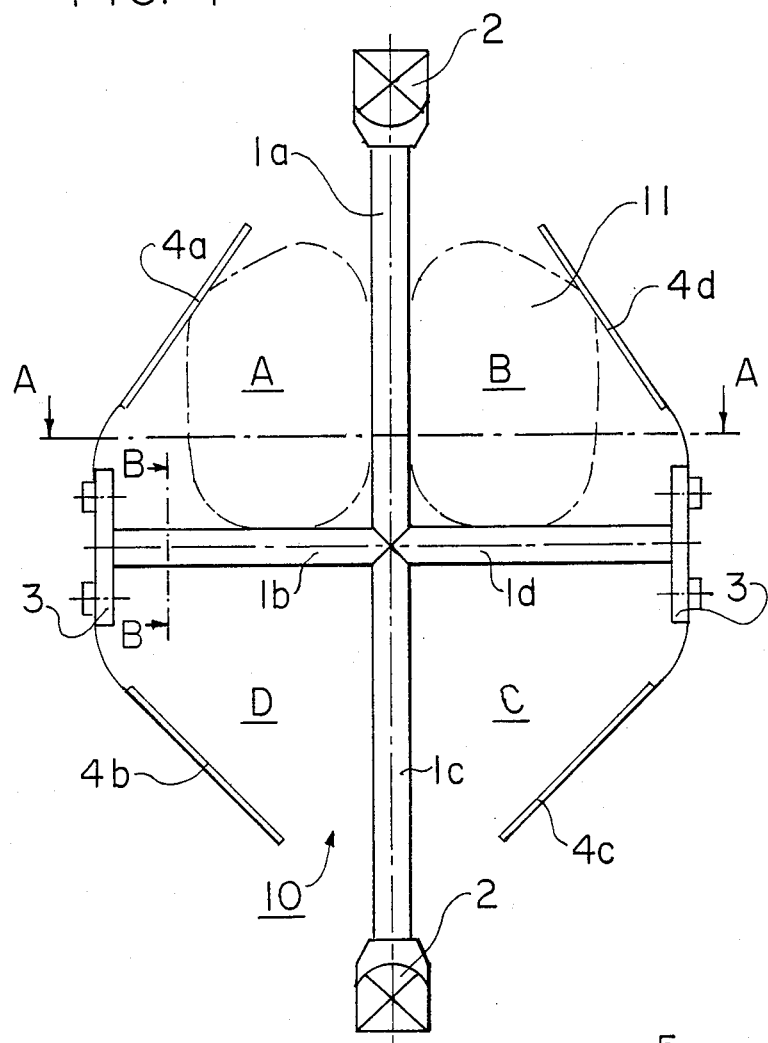
FIG. 1 is a front view of an inventive holder, with two spectacle lenses shown in place, and two others omitted.
Figure 2:
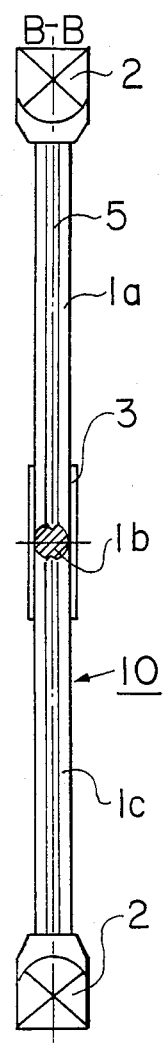
FIG. 2 is a sectional view taken along the line B—B of FIG. 1.
Figure 3:
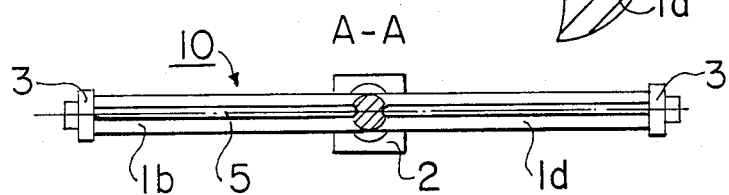
FIG. 3 is a sectional view taken along the line A—A of FIG. 1.

The two horizontal arms 1b, 1d shown in FIG. 1 of the rectangular cross carry on their front ends plate-shaped flanges 3 by which springs 4a to 4d are supported which are intended to apply against the articles to be treated, such as spectacle lenses 11 which are received in grooves 5 of the arms, and thus to hold and clamp them in place. The springs 4a, 4b, 4c and 4d are a channel section, and thus comprise a groove 5, and this groove is dimensioned to hold the lenses reliably, but only just to engage them within the area of the ground edge 11a, without covering any portion of the lens surface proper. The clamping springs 4a to 4d are resilient enough to permit insertion of various lens sizes. In spite of that and due to the rigid welding of the cross together, both secure handling and secure transportation are made possible without risking that the lenses may fall out.

It is evident that details of the invention as described may be varied without departing from the basic inventive idea. For example, end pieces 2 may be designed, in a manner known per se, as parts of fixing mechanisms. Also, other clamping springs 4 may be chosen and the grooves in the arms and springs may be conformed to the specific substrates to be treated, such as spectacle lenses, optical lenses, filter plates, etc.

While specific embodiments of the invention have been shown and described in detail to illustrate the application of the principles of the invention, it will be understood that the invention may be embodied otherwise without departing from such principles.

What is claimed is:

1. A holder for substrates comprising a rail structure formed of four arm portions which extend radially outwardly from a central area and define quadrants therebetween, each rail element bordering a quadrant having a surface facing toward the quadrant with a groove for receiving the substrate and a spring member carried by selective ones of said rail members extending into an adjacent quadrant and bearing on the substrate urging it into a receiving groove of said rail members.

2. A holder for holding a plurality of substrates to be treated, comprising four straight arms forming a cross, each arm having an inner end connected to the inner end of each other arm, each arm extending radially outwardly of its inner end and having an outer end, said four arms forming four quadrants, each of said arms having sides facing said quadrants with grooves in all of said sides for receiving a substrate, and spring means connected to at least some of said arms for engaging a substrate and biasing it in each quadrant toward said arms forming each quadrant.

3. A holder according to claim 2, wherein said spring means comprises a pair of clamp springs connected to its outer end of two of said arms which are diametrically opposed from each other, said clamp springs each being bent inwardly toward a separate one of said quadrants for engaging and holding a substrate into each of said quadrants.

4. A holder according to claim 3, including a connecting piece connected to diametrically opposed ones of said outer ends of said arms which are spaced away from said ends of said arms carrying said clamp springs, each end piece being adapted for engagement in a fixing mechanism to carry said holder.

5. A holder according to claim 4, wherein said arms carrying said end pieces are longer than said arms carrying said clamp springs.

* * * * *